(12) United States Patent
Yamashita et al.

(10) Patent No.: US 7,851,917 B2
(45) Date of Patent: Dec. 14, 2010

(54) WIRING STRUCTURE AND METHOD OF MANUFACTURING THE SAME

(75) Inventors: Tomio Yamashita, Ogaki (JP); Mitsuaki Morigami, Kishiwada (JP)

(73) Assignee: Sanyo Electric Co., Ltd., Osaka (JP)

( * ) Notice: Subject to any disclaimer, the term of this patent is extended or adjusted under 35 U.S.C. 154(b) by 350 days.

(21) Appl. No.: 12/147,122

(22) Filed: Jun. 26, 2008

(65) Prior Publication Data

US 2009/0001590 A1 Jan. 1, 2009

(30) Foreign Application Priority Data

Jun. 27, 2007 (JP) .............................. 2007-168588

(51) Int. Cl.
*H01L 23/52* (2006.01)
*H01L 23/48* (2006.01)
*H01L 29/40* (2006.01)

(52) U.S. Cl. .............................. 257/758; 257/E23.141; 257/751; 257/752; 438/637

(58) Field of Classification Search .......... 257/E23.141, 257/E21.495, 758, 751, 752, 760; 438/637, 438/629, 672
See application file for complete search history.

(56) References Cited

U.S. PATENT DOCUMENTS

| | | | |
|---|---|---|---|
| 5,933,756 A | 8/1999 | Fuse | |
| 6,291,848 B1 * | 9/2001 | Chetlur et al. | 257/306 |
| 6,566,242 B1 * | 5/2003 | Adams et al. | 438/622 |
| 6,727,589 B2 * | 4/2004 | Greco et al. | 257/751 |
| 6,806,579 B2 * | 10/2004 | Cowley et al. | 257/762 |
| 6,909,195 B2 * | 6/2005 | Li et al. | 257/774 |
| 6,930,038 B2 * | 8/2005 | Lin et al. | 438/633 |
| 7,026,714 B2 * | 4/2006 | Cunningham | 257/751 |
| 7,211,850 B2 | 5/2007 | Miura et al. | |
| 7,470,929 B2 * | 12/2008 | Hsu et al. | 257/50 |
| 7,732,314 B1 * | 6/2010 | Danek et al. | 438/584 |
| 2006/0024953 A1 * | 2/2006 | Papa Rao et al. | 438/629 |
| 2006/0024958 A1 * | 2/2006 | Ali | 438/638 |

FOREIGN PATENT DOCUMENTS

| | | |
|---|---|---|
| JP | 06-084788 A | 3/1994 |
| JP | 09-172017 A | 6/1997 |
| JP | 2003-107721 A | 4/2003 |
| JP | 2005-116756 A | 4/2005 |

* cited by examiner

*Primary Examiner*—Chris Chu
(74) *Attorney, Agent, or Firm*—Ditthavong, Mori & Steiner, P.C.

(57) ABSTRACT

A wiring structure includes a first wiring, a first interlayer dielectric film having a first opening, a second wiring formed with a first recess portion on a region corresponding to the first opening, a second interlayer dielectric film having a second opening and a third wiring so formed as to cover the second interlayer dielectric film, wherein an inner side surface of the second opening is arranged on a region corresponding to the first recess portion and formed such that an opening width of a portion in the vicinity of an upper end increases from a lower portion toward an upper portion.

20 Claims, 3 Drawing Sheets

WIRING STRUCTURE AND METHOD OF MANUFACTURING THE SAME

CROSS-REFERENCE TO RELATED APPLICATIONS

The priority application number JP2007-168588, Wiring Structure and Method of Manufacturing the Same, Jun. 27, 2007, Tomio Yamashita, Mitsuaki Morigami, upon which this patent application is based is hereby incorporated by reference.

BACKGROUND OF THE INVENTION

1. Field of the Invention

The present invention relates to a wiring structure and a method of manufacturing the same, and more particularly, it relates to a multilayer wiring structure and a method of manufacturing the same.

2. Description of the Background Art

A multilayer wiring structure is known in general.

A wiring structure of a semiconductor apparatus constituted by a first layer wiring (second wiring), an interlayer dielectric film (second interlayer dielectric film) formed on the first layer wiring, second layer wiring (third wiring) formed on the interlayer dielectric film is disclosed in general. The interlayer dielectric film is formed with a via hole having the same opening width from a lower end to an upper end, and the second layer wiring fills up the via hole.

In the conventional wiring structure of the semiconductor apparatus, however, the via hole has the same opening width from the lower end to the upper end and hence a portion where the second layer wiring has a small thickness is formed in the vicinity of an inner side surface of the via hole due to effects of shadowing (cumulatively reducing a growth rate of a portion shadowed in film formation) in forming the second layer wiring. In other words, coverage on the via hole by the second layer wiring is disadvantageously reduced. In this case, current density is increased on the portion where the coverage of the second layer wiring is reduced, and hence electromigration resistance is reduced. More specifically, a temperature of the portion where the second layer wiring has the small thickness is increased due to increase in the current density, and hence disconnection may be caused.

SUMMARY OF THE INVENTION

A wiring structure according to a first aspect of the present invention comprises a first wiring, a first interlayer dielectric film formed on the first wiring and having a first opening, a second wiring so formed as to cover the first interlayer dielectric film and formed with a first recess portion on a region corresponding to the first opening, a second interlayer dielectric film so formed as to cover the second wiring and having a second opening and a third wiring so formed as to cover the second interlayer dielectric film, wherein an inner side surface of the second opening is arranged on a region corresponding to the first recess portion and formed such that an opening width of a portion in the vicinity of an upper end increases from a lower portion toward an upper portion.

A method of manufacturing a wiring structure according to a second aspect of the present invention comprises steps of forming a first wiring, forming a first interlayer dielectric film on the first wiring and forming a first opening on the first interlayer dielectric film, forming a second wiring so as to cover the first interlayer dielectric film and be provided with a first recess portion on a region corresponding to the first opening, forming a second interlayer dielectric film so as to cover the second wiring and be provided with a recessed region on a region corresponding to the first recess portion, forming a second opening such that an inner side surface is arranged on the region corresponding to the first recess portion by removing a region of the second interlayer dielectric film, including a part of the recessed region and an opening width of a portion in the vicinity of an upper end of the inner side surface increases from a lower portion toward an upper portion and forming a third wiring so as to cover the second interlayer dielectric film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

Figure 1:
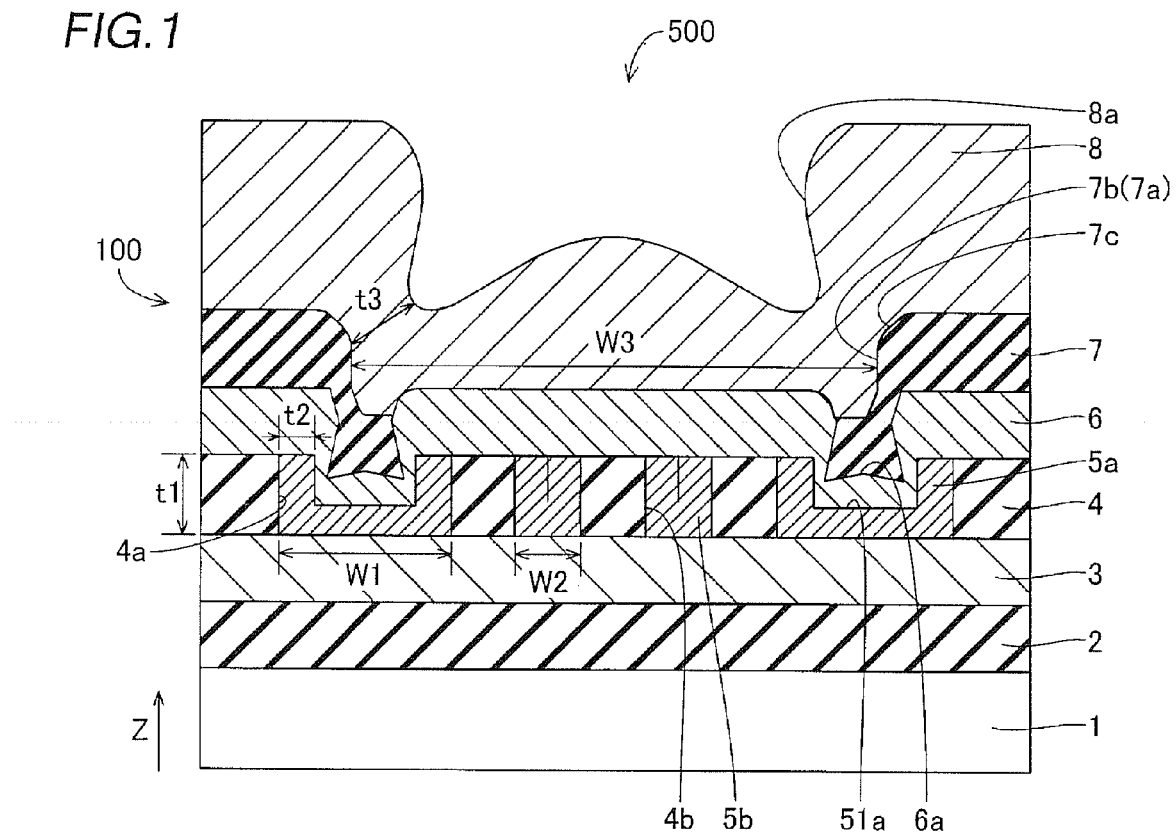
FIG. 1 is a sectional view showing a structure of a semiconductor apparatus to which a wiring structure according to an embodiment of the present invention is applied.

In a semiconductor apparatus 500, an underlayer insulating film 2 for forming a wiring structure 100 is formed on a surface of a silicon substrate 1 formed with a semiconductor device (not shown), as shown in FIG. 1. A wiring 3 made of AlCu or AlSiCu is formed on a surface of the underlayer insulating film 2. The wiring 3 is an example of the "first wiring" in the present invention.

Figure 2:
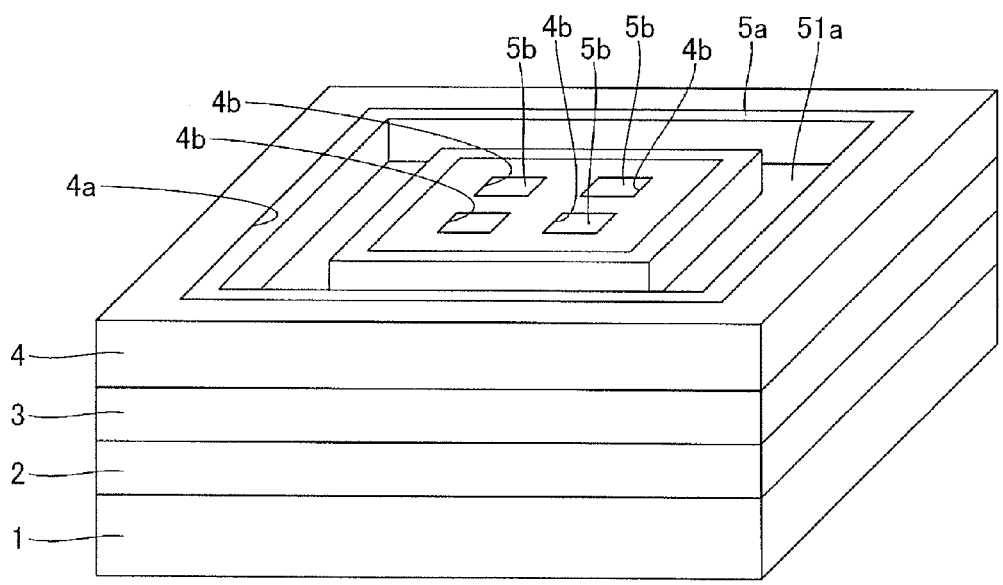
FIG. 2 is a perspective view for illustrating the wiring structure according to the embodiment shown in FIG. 1.

An interlayer dielectric film 4 made of $SiO_2$ is formed on a surface of the wiring 3. This interlayer dielectric film 4 has a thickness t1 and via holes 4a and 4b. The via hole 4a has a width W1 and the via holes 4b have widths W2 smaller than the width W1. The via hole 4a is formed in a groove shape to have a rectangular annular shape in plan view, as shown in FIG. 2. A plurality of the via holes 4b (four in this embodiment) are formed on a region surrounded by the via hole 4a. The interlayer dielectric film 4 is an example of the "first interlayer dielectric film" in the present invention, and the via holes 4a and 4b are examples of the "first opening" and the "third opening" in the present invention respectively.

As shown in FIG. 1, plugs 5a and 5b for being electrically connected to the wiring 3 and a wiring 6 described later are formed in the via holes 4a and 4b respectively. The plugs 5a and 5b include TiN layers and W layers formed through the TiN layers, and are formed by forming the same TiN and W layers in the via holes 4a and 4b. The TiN layer is provided for improving adhesion between the interlayer dielectric film 4 made of $SiO_2$ and the W layer and conformally forming the W layer (growing along the shape of the underlayer). The total thickness t2 of the layers (TiN and W layers) constituting the plug 5a is smaller than ½ of the width W1 of the via hole 4a and smaller than the thickness t1 of the interlayer dielectric film 4. The plug 5a is so formed as to have a recess portion 51a inside the via hole 4a. The plugs 5b fill up the overall via holes 4*b*. The plugs 5*a* and 5*b* are examples of the "first connecting portion" and the "second connecting portion" in the present invention respectively. The recess portion 51*a* is an example of the "second recess portion" in the present invention.

As shown in FIG. 1, the wiring 6 made of AlCu or AlSiCu is so formed as to cover the interlayer dielectric film 4, and the plugs 5*a* and 5*b*. The wiring 6 is provided with a recess portion 6*a* having a shape corresponding to the recess portion 51*a* above a region corresponding to the recess portion 51*a* of the plug 5*a*. The wiring 6 is an example of the "second wiring" in the present invention, and the recess portion 6*a* is an example of the "first recess portion" in the present invention. A bottom surface of the recess portion 6*a* is formed below an upper surface of the recess portion 51*a* of the plug 5*a*.

An interlayer dielectric film 7 made of $SiO_2$ is so formed as to cover the wiring 6. This interlayer dielectric film 7 has a via hole 7*a*. The via hole 7*a* has a width (opening width) W3 and provided for electrically connecting the wiring 6 and a wiring 8 described later. The via hole 7*a* is so arranged that an inner side surface 7*b* is arranged above a region corresponding to the recess portion 6*a* of the wiring 6. The inner side surface 7*b* of the via hole 7*a* is so formed that the width W3 of an upper end vicinity 7*c* increases from the lower portion toward the upper portion (along allow Z). The inner side surface 7*b* of the via hole 7*a* has a rounded sectional shape. The interlayer dielectric film 7 is an example of the "second interlayer dielectric film" in the present invention, and the via hole 7*a* is an example of the "second opening" in the present invention.

The wiring 8 made of AlCu or AlSiCu is so formed as to cover the interlayer dielectric film 7. The wiring 8 is provided with a recess portion 8*a* above a region corresponding to the via hole 7*a*. The wiring 8 is an example of the "third wiring" in the present invention. The recess portion 8*a* is an example of the "third recess portion" in the present invention. A portion of the wiring 8, corresponding to the recess portion 6*a* is so formed as to project toward the recess portion 6*a*. The recess portion 8*a* of the wiring 8 is formed inward beyond the recess portion 6*a*. The wiring structure 100 is constituted by the wiring 3, the interlayer dielectric film 4, the plugs 5*a* and 5*b*, the wiring 6, the interlayer dielectric film 7 and the wiring 8.

Figure 3:
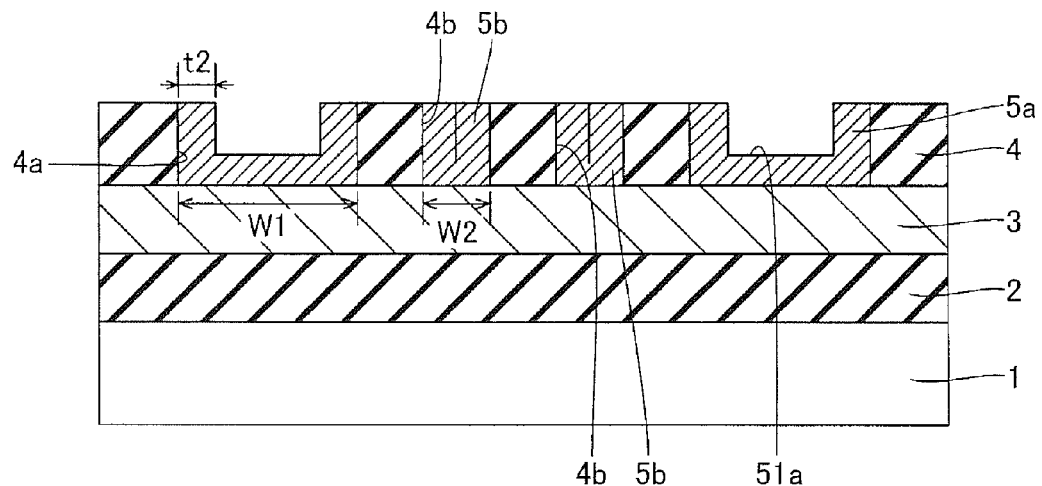
FIGS. 3 to 5 are sectional views for illustrating a manufacturing process for the semiconductor apparatus to which the wiring structure according to the embodiment of the present invention is applied.

In a manufacturing process for the semiconductor apparatus 500, to which the wiring structure 100 according to the embodiment of the present invention is applied, the semiconductor device (not shown) is formed on the surface of the silicon substrate 1 and the underlayer insulating film 2 is formed on the surface of the silicon substrate 1, as shown in FIG. 3.

The wiring 3 made of AlCu or AlSiCu is formed on the surface of the underlayer insulating film 2 by sputtering. Thereafter the interlayer dielectric film 4 made of $SiO_2$ having flatness is formed on the surface of the wiring 3.

A prescribed region of the interlayer dielectric film 4 is patterned by photolithography and etching. Thus, the via hole 4*a* having the width W1 and the via holes 4*b* having widths W2 smaller than the width W1 are formed.

As shown in FIG. 3, the plug 5*a* is formed in the via hole 4*a* and the plugs 5*b* are formed in the via holes 4*b*. More specifically, the TiN layer is so formed as to be in contact with the wiring 3 and cover the interlayer dielectric film 4 by CVD or PVD (physical vapor deposition). Then the W layer is conformally formed on the TiN layer by CVD. Thereafter they are polished by CMP. In this case, the total thickness t2 of the TiN layer and the W layer is set to be smaller than ½ of the width W1 of the via hole 4*a* and larger than ½ of the widths W2 of the via holes 4*b*, whereby the via holes 4*a* and 4*b* are formed with the plug 5*a* having the recess portion 51*a* and the plugs 5*b* filling up the overall via holes 4*b*. The recess portion 51*a* is formed in the groove shape as shown in FIG. 2.

Figure 4:
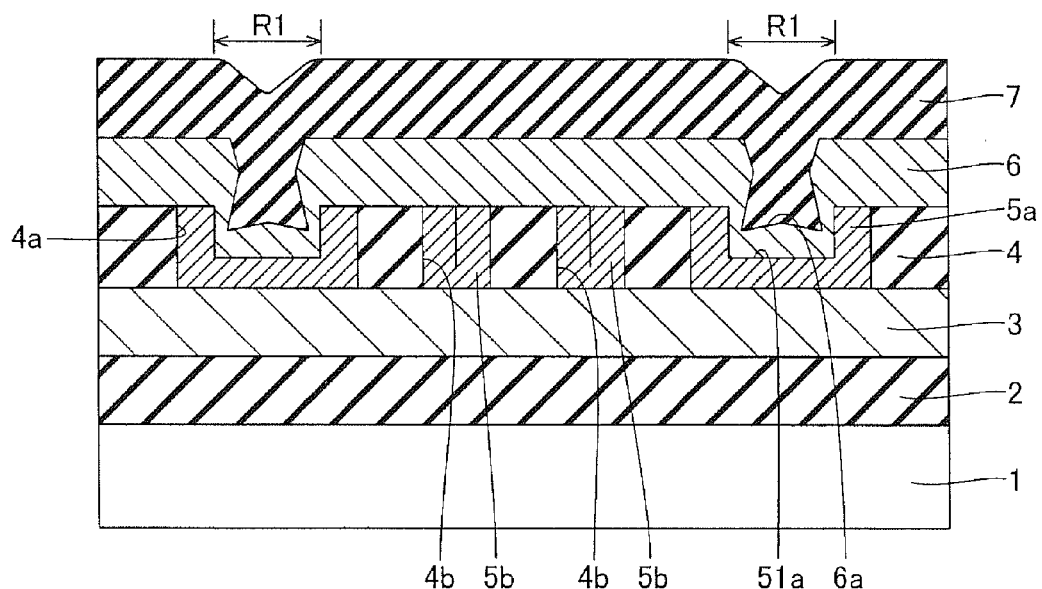

As shown in FIG. 4, the wiring 6 made of AlCu or AlSiCu is so formed as to cover the interlayer dielectric film 4 and the plugs 5*a* and 5*b* by sputtering. At this time, the wiring 6 is formed with the recess portion 6*a* having the shape corresponding to the recess portion 51*a* above the region corresponding to the recess portion 51*a* of the plug 5*a*. In other words, the recess portion 6*a* is formed in the groove shape.

The interlayer dielectric film 7 made of $SiO_2$ is SO formed as to cover the wiring 6. More specifically, the $SiO_2$ layer is formed by CVD employing TEOS and thereafter the $SiO_2$ layer is formed by SOG. At this time, the interlayer dielectric film 7 is formed with a recessed region R1 having a shape corresponding to the recess portion 6*a* above the region corresponding to the recess portion 6*a* of the wiring 6.

Figure 5:
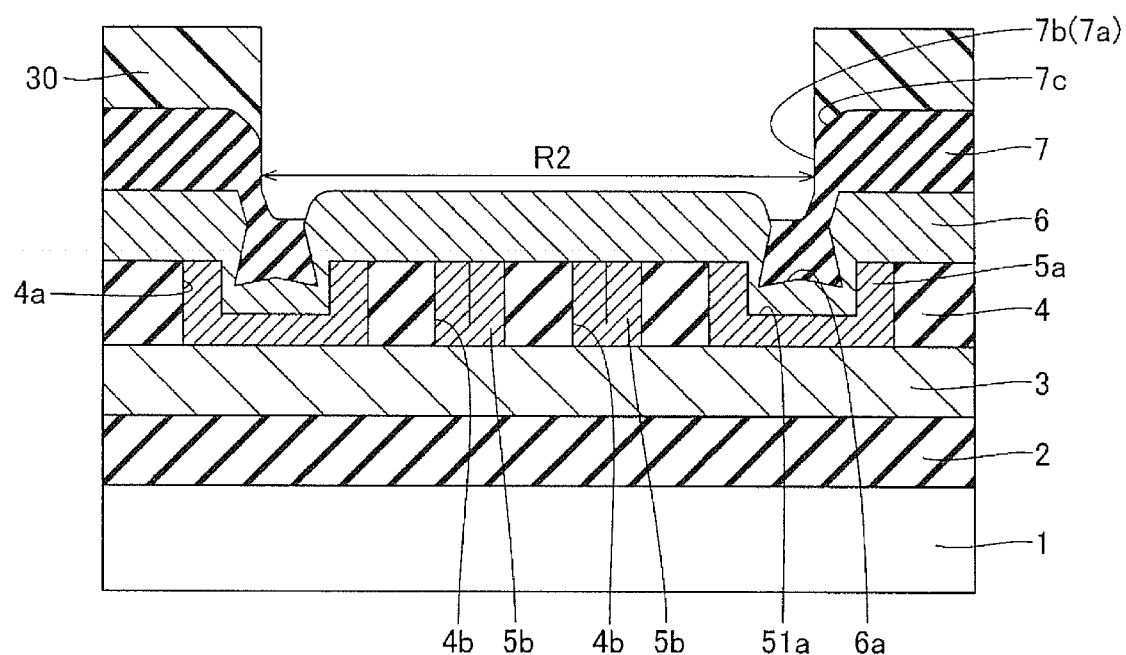

As shown in FIG. 5, a resist film 30 is formed on a prescribed region by photolithography. Then resist film 30 is employed as a mask for patterning the interlayer dielectric film 7 by anisotropic etching. Thus, a region R2 including a part of the recessed region R1 (see FIG. 4) in the interlayer dielectric film 7 is removed, thereby forming the via hole 7*a*. At this time, the inner side surface 7*b* of the via hole 7*a* is arranged above the region corresponding to the recess portion 6*a* of the wiring 6. The inner side surface 7*b* of the via hole 7*a* is so formed that the width W3 (see FIG. 1) of the upper end vicinity 7*c* increases from the lower portion toward the upper portion. Thereafter the resist film 30 is removed.

As shown in FIG. 1, the wiring 8 made of AlCu or AlSiCu is so formed as to cover the interlayer dielectric film 7 by sputtering. At this time, the wiring 8 is formed with the recess portion 8*a* above the region corresponding to the via hole 7*a*.

The semiconductor apparatus 500, to which the wiring structure 100 according to this embodiment is applied, is formed in the aforementioned manner.

According to this embodiment, as hereinabove described, the via hole 7*a* having the inner side surface 7*b* so formed that the width W3 of the upper end vicinity 7*c* increases from the lower portion to the upper portion (along arrow Z) is provided, whereby reduction of a thickness t3 of the wiring 8 (see FIG. 1) in the vicinity of the inner side surface 7*b* of the via hole 7*a* can be suppressed by effects of shadowing (cumulatively reducing a growth rate of a portion shadowed in film formation) in forming the wiring 8. In other words, reduction of wiring coverage on the via hole 7*a* by the wiring 8 can be suppressed and hence reduction in electromigration resistance of the wiring 8 can be suppressed. More specifically, a certain amount of the thickness can be ensured on a portion where the wiring 8 has the thickness t3 (in the vicinity of the inner side surface 7*b* of the via hole 7*a*) and hence increase of current density on the portion can be suppressed. Consequently, increase of the temperature of the wiring 8 in the vicinity of the inner side surface 7*b* of the via hole 7*a* due to increase of the current density can be suppressed and hence disconnection of the wiring 8 can be suppressed. Therefore, reduction in electromigration resistance of the wiring 8 can be suppressed in the wiring structure 100 and hence the wiring 8, having high reliability can be obtained by employing AlCu or AlSiCu. Additionally, the manufacturing cost of the wiring structure 100 can be reduced by employing AlCu or AlSiCu as the wiring 8 as compared with a case of employing a Cu wiring.

According to this embodiment, the plug 5*a* having the recess portion 51*a* is provided, whereby the recess portion 6*a* can be formed above the region corresponding to the recess portion 51*a* when forming the wiring 6. The recessed region R1 can be formed above the region corresponding to the recess portion 6a when forming the interlayer dielectric film 7. Thus, the region R2 including a part of the recessed region R1 is removed by etching when forming the via hole 7a, whereby the inner side surface 7b having the upper end vicinity 7c with the width W3 increasing from the lower portion toward the upper portion can be formed. Therefore, a step of forming the inner side surface 7b such that the width W3 of the upper end vicinity 7c of the inner side surface 7b increases from the lower portion toward the upper portion may not be separately provided, and hence increase in the number of fabrication steps can be suppressed.

According to this embodiment, plug 5a is formed in an annular shape, whereby the contact area between the plug 5a and the wiring 6 can be increased as compared with the plugs 5b and hence electrical resistance between the wirings 3 and 6 can be reduced.

According to this embodiment, the annular recess portion 51a in plan view is formed, whereby the shape of the recess portion 51a can be reflected in the wiring 6 and the via hole 7a formed on the surface of the recess portion 51a and hence reduction of the thickness t3 of each side of the via hole 7a can be suppressed. Thus, reduction of the wiring coverage on the via hole 7a by the wiring 8 can be suppressed.

According to this embodiment, the thickness t2 of the plug 5a is smaller than ½ of the width W1 of the via hole 4a and smaller than the thickness t1 of the interlayer dielectric film 4, whereby the recess portion 51a can be easily formed when conformally forming the plug 5a.

According to this embodiment, the upper end vicinity 7c of the via hole 7a is formed in the rounded shape, whereby the larger thickness can be ensured on the portion where the wiring 8 has the thickness t3 and hence increase of the current density on the portion can be suppressed.

According to this embodiment, the portion corresponding to the recess portion 6a on the lower surface of the wiring 8 is so formed as to project toward the recess portion 6a, whereby the larger thickness can be ensured on the portion where the wiring 8 has the thickness t3 and hence increase of current density on the portion can be further suppressed.

According to this embodiment, the recess portion 8a is formed on the portion corresponding to the via hole 7a of the wiring 8 and the side surfaces of the recess portion 8a are formed inward beyond the side surfaces of the recess portion 6a, whereby the thickness can be easily ensured on the portion where the wiring 8 has the thickness t3.

According to this embodiment, the thickness of the recess portion 51a of the plug 5a is smaller than ½ of the width W1 of the via hole 4a and smaller than the thickness t1 of the interlayer dielectric film 4, whereby the recess portion 51a can be easily formed.

According to this embodiment, the plug 5a includes the TiN layer formed in contact with the via hole 4a of the interlayer dielectric film 4 and the W layer formed on the surface of the TiN layer, whereby the W layer can be conformally formed by adhesion between the TiN layer and the interlayer dielectric film 4.

According to this embodiment, the bottom surface of the recess portion 6a of the wiring 6 is formed below the upper surface of the recess portion 51a of the plug 5a, whereby the recessed region R1 of the interlayer dielectric film 7 can be more deeply recessed.

Although the present invention has been described and illustrated in detail, it is clearly understood that the same is by way of illustration and example only and is not to be taken by way of limitation, the spirit and scope of the present invention being limited only by the terms of the appended claims.

For example, while the rectangular annular via hole 4a in plan view is formed, the annular recess portions 51a and 6a are formed and the via hole 7a is formed in the aforementioned embodiment, the present invention is not restricted to this but a circular annular via hole in plan view may be formed on the interlayer dielectric film 4 so that circular annular recess portions in plan view is formed on the plug 5a and the wiring 6 and a circular via hole in plan view is formed on the interlayer dielectric film 7, for example. According to this structure, reduction of the wiring coverage on the via hole by the wiring 8 can be suppressed.

While the plurality (four) of via holes 4b (plugs 5b) are formed in the via hole 4a (plug 5a) in the aforementioned embodiment, the present invention is not restricted to this but one via hole 4b (plug 5b) may be formed inside the via hole 4a (plug 5a). Alternatively, the via holes 4b (plugs 5b) may be formed outside the via holes 4a (plugs 5a).

While the via holes 4b are formed and the plugs 5b fill up the overall via holes 4b in the aforementioned embodiment, the present invention is not restricted to this but the via hole may be formed in a groove shape to have an annular shape in plan view and the plug may be fill up the overall groove-shaped via hole.

While the plugs 5a and 5b are formed by CMP after staking the TiN and W layers in the aforementioned embodiment, the present invention is not restricted to this but the plugs 5a and 5b may be formed by etching-back, after stacking the TiN and W layers.

While the inner side surface 7b of the via hole 7a is arranged above the region corresponding to the recess portion 6a of the wiring 6 in the aforementioned embodiment, the present invention is not restricted to this but at least a part of the inner side surface 7b of the via hole 7a may be arranged above the region corresponding to the recess portion 6a of the wiring 6.

While the wiring structure 100 of the three layers including the wirings 3, 6 and 8 is shown in the aforementioned embodiment, the present invention is not restricted to this but the present invention is also applicable for a wiring structure of at least four layers.

What is claimed is:

1. A wiring structure comprising:
   a first wiring;
   a first interlayer dielectric film formed on said first wiring and having a first opening;
   a second wiring so formed as to cover said first interlayer dielectric film and formed with a first recess portion on a region corresponding to said first opening;
   a second interlayer dielectric film so formed as to cover said second wiring and having a second opening; and
   a third wiring so formed as to cover said second interlayer dielectric film, wherein
   an inner side surface of said second opening is arranged on a region corresponding to said first recess portion and formed such that an opening width of a portion in the vicinity of an upper end increases from a lower portion toward an upper portion.

2. The wiring structure according to claim 1, wherein said portion in the vicinity of said upper end of said second opening is formed in a rounded shape.

3. The wiring structure according to claim 1, wherein a portion of a lower surface of said third wiring, corresponding to said first recess portion projects toward said first recess portion.

4. The wiring structure according to claim 1, wherein a portion of said third wiring, corresponding to said second opening is formed with a third recess portion and said third recess portion is formed inward beyond said first recess portion.

5. The wiring structure according to claim 1, further comprising a connecting portion provided for electrically connecting said first wiring and said second wiring, wherein
   said connecting portion includes a first connecting portion formed in said first opening and having a second recess portion, and
   said first recess portion is formed on a region corresponding to said second recess portion.

6. The wiring structure according to claim 5, wherein
   said first interlayer dielectric film further includes a third opening having a width smaller than a width of said first opening, and
   said connecting portion includes a second connecting portion filling up overall said third opening.

7. The wiring structure according to claim 6, wherein said third opening is formed inside said first opening.

8. The wiring structure according to claim 5, wherein
   a thickness of said second recess portion of said first connecting portion is smaller than ½ of a width of said first opening and smaller than a thickness of said first interlayer dielectric film.

9. The wiring structure according to claim 5, wherein
   said first connecting portion includes a TiN layer formed in contact with said first opening of said first interlayer dielectric film and a W layer formed on a surface of said TiN layer.

10. The wiring structure according to claim 5, wherein
    a bottom surface of said first recess portion of said second wiring is formed below an upper surface of said second recess portion of said first connecting portion.

11. The wiring structure according to claim 1, wherein
    said first opening is formed in an annular shape in plan view, and
    said first recess portion is formed in an annular shape in plan view.

12. A method of manufacturing a wiring structure, comprising steps of:
    forming a first wiring;
    forming a first interlayer dielectric film on said first wiring and forming a first opening on said first interlayer dielectric film;
    forming a second wiring so as to cover said first interlayer dielectric film and be provided with a first recess portion on a region corresponding to said first opening;
    forming a second interlayer dielectric film so as to cover said second wiring and be provided with a recessed region on a region corresponding to said first recess portion;
    forming a second opening such that an inner side surface is arranged on said region corresponding to said first recess portion by removing a region of said second interlayer dielectric film, including a part of said recessed region, and an opening width of a portion in the vicinity of an upper end of said inner side surface increases from a lower portion toward an upper portion; and
    forming a third wiring so as to cover said second interlayer dielectric film.

13. The method of manufacturing a wiring structure according to claim 12, wherein
    said step of forming said second opening includes a step of forming said portion in the vicinity of said upper end of said second opening in a rounded shape.

14. The method of manufacturing a wiring structure according to claim 12, wherein
    said step of forming said second opening includes a step of removing said region of said second interlayer dielectric film, including a part of said recessed region by etching.

15. The method of manufacturing a wiring structure according to claim 12, wherein
    said step of forming said third wiring includes a step of forming said third wiring such that a portion of a lower surface of said third wiring, corresponding to said first recess portion projects toward said first recess portion.

16. The method of manufacturing a wiring structure according to claim 12, wherein
    said step of forming said third wiring includes a step of forming a third recess portion on a portion of said third wiring, corresponding to said second opening inward beyond said first recess portion.

17. The method of manufacturing a wiring structure according to claim 12, further comprising a step of forming a connecting portion for electrically connecting said first wiring and said second wiring between said step of forming said first opening and said step of forming said second wiring, wherein
    said step of forming said connecting portion includes a step of forming a first connecting portion having a second recess portion in said first opening.

18. The method of manufacturing a wiring structure according to claim 12, wherein
    said step of forming said first opening in said first interlayer dielectric film includes a step of forming a third opening having a width smaller than that of said first opening on said first interlayer dielectric film, and
    said step of forming said connecting portion includes a step of filling up overall said third opening with a second connecting portion.

19. The method of manufacturing a wiring structure according to claim 12, wherein
    said step of forming said first opening includes a step of forming said first opening in an annular shape in plan view.

20. The method of manufacturing a wiring structure according to claim 12, wherein
    said step of forming said second wiring provided with said first recess portion includes a step of forming said first recess portion in an annular shape in plan view.

* * * * *